United States Patent
Nonogaki et al.

(10) Patent No.: US 9,024,519 B2
(45) Date of Patent: May 5, 2015

(54) α-SIALON, LIGHT-EMITTING DEVICE AND USE THEREOF

(75) Inventors: Ryozo Nonogaki, Machida (JP); Tomohiro Nomiyama, Machida (JP); Mitsuru Kawagoe, Machida (JP); Suzuya Yamada, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 2 days.

(21) Appl. No.: 13/981,286

(22) PCT Filed: Nov. 30, 2011

(86) PCT No.: PCT/JP2011/077606
§ 371 (c)(1),
(2), (4) Date: Jul. 23, 2013

(87) PCT Pub. No.: WO2012/101899
PCT Pub. Date: Aug. 2, 2012

(65) Prior Publication Data
US 2013/0293093 A1 Nov. 7, 2013

(30) Foreign Application Priority Data
Jan. 26, 2011 (JP) .................. 2011-014269

(51) Int. Cl.
*H05B 33/14* (2006.01)
*H05B 33/12* (2006.01)
*C09K 11/08* (2006.01)
(Continued)

(52) U.S. Cl.
CPC ............... *H05B 33/14* (2013.01); *H05B 33/12* (2013.01); *Y10T 428/2982* (2015.01); *H01L 33/502* (2013.01); *C09K 11/0883* (2013.01); *C09K 11/7734* (2013.01)

(58) Field of Classification Search
CPC .............................. H05B 33/14; H05B 33/12
See application file for complete search history.

(56) References Cited

U.S. PATENT DOCUMENTS

| 2008/0064586 A1* | 3/2008 | Mitomo et al. ............ 501/98.2 |
| 2010/0164367 A1* | 7/2010 | Shioi et al. .................. 313/503 |

(Continued)

FOREIGN PATENT DOCUMENTS

| JP | 2004-186278 A | 7/2004 |
| JP | 2006-41096 A  | 2/2006 |

(Continued)

*Primary Examiner* — Elmito Breval
(74) *Attorney, Agent, or Firm* — Stein IP, LLC

(57) ABSTRACT

Provided are an α-SiAlON activated by Eu, which can realize a higher luminance in a light-emitting device such as a white LED, and also a light-emitting device. The α-SiAlON is represented by the general formula: $(M)_x(Eu)_y(Si)_{12-(m+n)}(Al)_{m+n}(O)_n(N)_{16-n}$ (wherein M denotes one or more elements including at least Ca, selected from the group consisting of Li, Mg, Ca, Y and lanthanide elements (except for La and Ce)), and is constituted by an α-SiAlON having Eu in the form of a solid solution. The 50% mean area diameter of primary particles of the α-SiAlON is 5 μm or more, and the ratio of the 50% mean area diameter of primary particles to the 50% mean area diameter of secondary particles of the α-SiAlON is preferably 0.56 or more. A light-emitting device 10 includes a light-emitting light source 12 and a wavelength conversion member 15, wherein the wavelength conversion member 15 includes a α-SiAlON 18 for absorbing near-ultraviolet to blue light generated by the light-emitting light source 12 to generate yellow to orange light.

13 Claims, 7 Drawing Sheets

(51) Int. Cl.
*C09K 11/77* (2006.01)
*H01L 33/50* (2010.01)

(56) References Cited

U.S. PATENT DOCUMENTS

| | | | |
|---|---|---|---|
| 2010/0200874 A1* | 8/2010 | Shioi et al. | 257/91 |
| 2010/0213820 A1* | 8/2010 | Sakai et al. | 313/501 |
| 2010/0231121 A1* | 9/2010 | Kaneda et al. | 313/503 |
| 2010/0237767 A1* | 9/2010 | Emoto et al. | 313/503 |
| 2011/0084235 A1* | 4/2011 | Nagatomi et al. | 252/301.4 R |
| 2011/0133629 A1* | 6/2011 | Sakata et al. | 313/483 |

FOREIGN PATENT DOCUMENTS

| | | |
|---|---|---|
| JP | 2006-52337 A | 2/2006 |
| JP | 2008-263209 A | 10/2008 |
| JP | 2009-96882 A | 5/2009 |
| WO | WO 2006/093135 A1 | 9/2006 |
| WO | WO 2007/129713 A1 | 11/2007 |
| WO | WO 2008/004640 A1 | 1/2008 |
| WO | WO 2008/084848 A1 | 7/2008 |
| WO | WO 2008/114568 A1 | 9/2008 |

* cited by examiner

α-SIALON, LIGHT-EMITTING DEVICE AND USE THEREOF

CROSS-REFERENCE TO RELATED APPLICATIONS

This application is a national stage application of PCT Application No. PCT/JP2011/077606, filed Nov. 30, 2011, which claims the benefit of Japanese Application No. JP 2011-014269, filed Jan. 26, 2011, in the Japanese Intellectual Property Office. All disclosures of the document(s) named above are incorporated herein by reference.

BACKGROUND OF THE INVENTION

1. Field of the Invention

The present invention relates to an α-SiAlON to be utilized as a phosphor, and a light-emitting device, an illumination device, a signal device, a liquid crystal panel and an image display device utilizing the same.

2. Description of the Related Art

α-SiAlONs activated by a particular rare-earth element, as nitride or oxynitride phosphors, have been known to have useful fluorescence characteristics, and have been applied to a white LED and the like. α-SiAlONs have such a construction that Si—N bonds of an α-silicon nitride crystal are partially substituted with Al—N bonds and an Al—O bonds, and particular elements (Ca, and Li, Mg, Y or a lanthanide metal except for La and Ce) penetrate into a crystal lattice in the form of solid solutions in order to maintain electric neutrality. A rare-earth element serving as a luminescent center is used as a part of the elements penetrating in the form of solid solutions to thereby exert fluorescence characteristics. Among them, an α-SiAlON phosphor in which Ca is present in the form of a solid solution and a part thereof is substituted with Eu is excited at a relatively good efficiency in a wide wavelength region of ultraviolet to blue to emit yellow to orange light. As an attempt for further improving fluorescence characteristics of such an α-SiAlON, for example, selecting of an α-SiAlON having a particular average particle diameter by a classification treatment has been proposed (Patent Document 1).

CITATION LIST

Patent Document

Patent Document 1: Japanese Patent Laid-Open No. 2009-96882

SUMMARY OF TOE INVENTION

Technical Problem

Additional aspects and/or advantages of the invention will be set forth in part in the description which follows and, in part, will be obvious from the description, or may be learned by practice of the invention.

An object of the present invention is to provide an α-SiAlON having a higher light-emitting efficiency, and to provide a light-emitting device and the like utilizing the α-SiAlON, which can emit light at a high efficiency.

Solution to Problem

An α-SiAlON of the present invention is an α-SiAlON represented by the general formula: $(M)_x(Eu)_y(Si)_{12-(m+n)}(Al)_{m+n}(O)_n(N)_{16-n}$ (wherein M denotes one or more elements including at least Ca, selected from the group consisting of Li, Mg, Ca, Y and lanthanide elements (except for La and Ce)), wherein the 50% mean area diameter of primary particles of the α-SiAlON is 5 μm or more.

The ratio of the 50% mean area diameter of primary particles to the 50% mean area diameter of secondary particles of the α-SiAlON is preferably 0.56 or more.

The average number of primary particles in secondary particles of the α-SiAlON is preferably 2.5 or less.

The 10% mean area diameter of primary particles of the α-SiAlON is preferably 3 μm or more.

The ratio of the 10% mean area diameter of primary particles to the 10% mean area diameter of secondary particles of the α-SiAlON is preferably 0.65 or more.

The D50 particle diameter (50% mean volume diameter) of secondary particles of the α-SiAlON is preferably 13 μm or more and 30 μm or less.

A light-emitting device of the present invention includes a light-emitting light source and a wavelength conversion member, wherein the wavelength conversion member includes a phosphor for absorbing near-ultraviolet to blue light generated by the light-emitting light source to generate fluorescence, and the phosphor is the α-SiAlON.

The phosphor preferably contains a β-SiAlON having Eu in the form of a solid solution, in addition to the α-SiAlON. Alternatively, the phosphor preferably contains a β-SiAlON having Eu in the form of a solid solution, and $CaAlSiN_3$, in addition to the α-SiAlON.

The light-emitting light source in the light-emitting device is preferably an LED chip for generating light of a wavelength of 300 nm to 500 nm.

The present invention also relates to an illumination device, a signal device, a liquid crystal panel and an image display device having the light-emitting device. Examples of the signal device include a traffic signal installed at an intersection, and a direction indicator for automobiles and motorcycles, and examples of the image display device include an image display device for displaying an image on a liquid crystal panel, and a projector for displaying an image on a screen.

Advantageous Effects of Invention

According to the present invention, there can be provided an α-SiAlON having a high light-emitting efficiency, and there can be provided a light-emitting device, an illumination device, a signal device, a liquid crystal panel and an image display device having a high light-emitting efficiency.

According to the light-emitting device of the present invention, the α-SiAlON that can realize a high light-emitting efficiency is used, and thus a light-emitting device having a high luminance can be provided.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
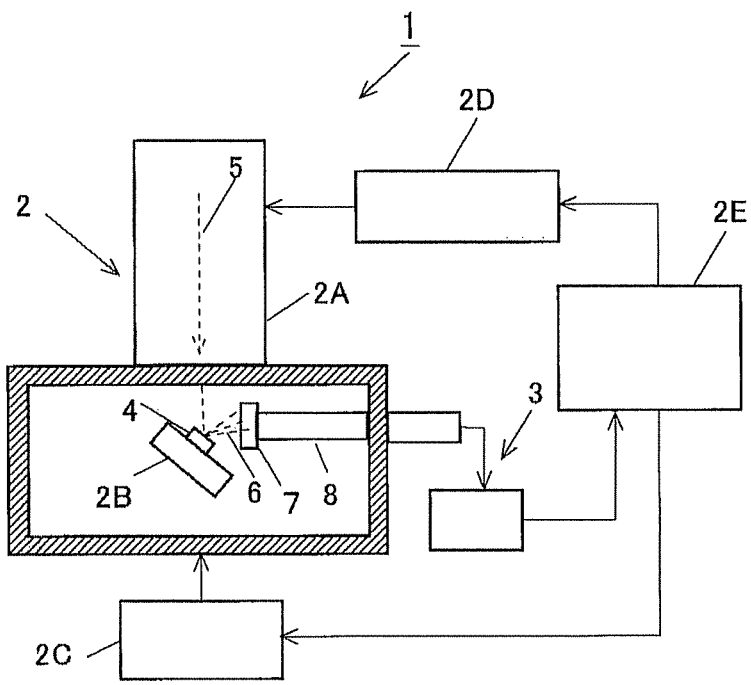
FIG. 1 is a schematic diagram illustrating a configuration of a device for use in measurement by the EBSD method.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

(α-SiAlON)

An α-SiAlON of an embodiment of the present invention is an α-SiAlON represented by the general formula: $(M)_x(Eu)_y(Si)_{12-(m+n)}(Al)_{m+n}(O)_n(N)_{16-n}$ (wherein M denotes one or more elements including at least Ca, selected from the group consisting of Li, Mg, Ca, Y and lanthanide elements (except for La and Ce)), wherein the 50% mean area diameter of primary particles of the α-SiAlON is 5 µm or more.

The solid solution composition of the α-SiAlON is expressed by x and y, and m and n determined by the Si/Al ratio and the O/N ratio associated therewith in the general formula. In particular, Ca is used as M to thereby stabilize the α-SiAlON in a wide composition range, and a part thereof is substituted with Eu serving as a luminescent center to thereby provide a phosphor to be excited by light of a wide wavelength region of ultraviolet to blue to emit yellow to orange visible light.

The solid solution composition of a general α-SiAlON cannot be strictly defined by a composition analysis or the like because of a second crystalline phase different from the α-SiAlON and a non-crystalline phase whose presence cannot be avoided. The crystalline phase of the α-SiAlON is preferably an α-SiAlON single phase, and may include, as other crystalline phase, a β-SiAlON, aluminium nitride, or a polytypoid thereof.

As the method for manufacturing the α-SiAlON, there is a method in which a mixed powder including silicon nitride, aluminium nitride and a compound of an element penetrating as a solid solution is heated in a nitrogen atmosphere at a high temperature to be reacted with one another. A part of constituent components forms a liquid phase in the heating step, and substances move to this liquid phase, thereby producing an α-SiAlON solid solution. In the α-SiAlON after synthesis, a plurality of equiaxed primary particles are sintered to form massive secondary particles. The primary particle in the present invention refers to a minimum particle that has identical crystal orientations in the particle and that can be present alone.

The present inventors have studied a relationship between light-emitting characteristics and particle properties, and have obtained such a finding that light-emitting intensity can be controlled by the 50% mean area diameter or the 10% mean area diameter of primary particles of the α-SiAlON (hereinafter, these will be collectively referred to as the mean area diameter), thereby leading to the present invention.

First, the mean area diameter of primary particles of the α-SiAlON is described. An aggregation of primary particles is defined, in which individual primary particles of the α-SiAlON, namely, single-crystal particles are arranged in order from small to large cross-sectional areas, $C_{A1}, C_{A2}, C_{A3}, \ldots, C_{Ai}, \ldots, C_{Ak}$. Primary particles referred herein mean all single-crystal particles, and include those in which a plurality of primary particles are sintered together via particle boundaries to constitute secondary particles, and those not constituting secondary particles, without distinction. When the total cross-sectional area of the aggregation of primary particles $(C_{A1}+C_{A2}+C_{A3}+ \ldots +C_{Ai}+ \ldots +C_{Ak})$ is regarded as 100% to determine a cumulative curve, the primary particle diameters calculated from the cross-sectional areas $(s_{10}, s_{50})$ of primary particles at the points where the cumulative curve reaches 10% and 50% are defined as the 10% mean area diameter and the 50% mean area diameter of primary particles, respectively.

The mean area diameter of secondary particles of the α-SiAlON can also be described as above. That is, an aggregation of secondary particles is defined, in which secondary particles formed by sintering primary particles of the α-SiAlON are arranged in order from small to large cross-sectional are as, $C_{B1}, C_{B2}, C_{B3}, \ldots, C_{Bi}, \ldots, C_{Bk}$. When the total cross-sectional area of the aggregation of secondary particles $(C_{B1}+C_{B2}+C_{B3}+ \ldots +C_{Bi}+ \ldots +C_{Bk})$ is regarded as 100% to determine a cumulative curve, the secondary particle diameters calculated from the cross-sectional areas $(S_{10}, S_{50})$ of secondary particles at the points where the cumulative curve reaches 10% and 50% are defined as the 10% mean area diameter and the 50% mean area diameter of secondary particles, respectively.

Then, a specific method for determining the mean area diameters of primary particles and secondary particles is described. In order to determine the mean area diameters, it is necessary that the cross-sectional areas of primary particles and secondary particles be measured to create the respective cumulative curves. The cross-sectional areas of particles are measured utilizing the electron backscatter diffraction image method (Electron backscatter diffraction, hereinafter also referred to as the EBSD method). FIG. 1 is a schematic diagram illustrating a configuration of a device for use in measurement by the EBSD method. As illustrated in FIG. 1, a device 1 for use in the EBSD method is configured from a device in which a measuring device 3 for use in the electron backscatter diffraction image method is added to a scanning electron microscope 2. The scanning electron microscope 2 is configured from a lens tube 2A, a stage unit 2B on which a sample 4 is to be placed, a stage control unit 2C, an electron beam scanning unit 2D, a control computer 2E, and the like. The measuring device 3 for use in the electron backscatter diffraction image method is configured from a fluorescent screen 7 for detecting electrons 6 generated by irradiation of the sample 4 with an electron beam 5 and backscattered, a camera 8 for taking a fluorescent image of the fluorescent screen 7, a software for acquiring and analyzing electron backscatter diffraction image data, not illustrated, and the like.

This device is used to irradiate the α-SiAlON being the sample 4 with an electron beam to thereby allow electron scattering corresponding to a crystal structure and a crystal plane to occur, and the shape of the electron scattering pattern is analyzed by the software. More specifically, crystal orientations in individual phosphor particles are identified, and the cross-sectional area of primary particles that can be distinguished for every crystal orientation is determined by an image analysis. In this time, the same EBSD image as that used for calculating the mean area diameter of primary particles is again used to determine the cross-sectional area of secondary particles in which a plurality of primary particles are sintered together via particle boundaries.

Then, a cumulative curve is created as described above from the obtained cross-sectional areas to determine the cross-sectional areas $s_{10}$ and $s_{50}$ of primary particles at the points where the cumulative curve reaches 10% and 50%, and these cross-sectional areas are used to calculate the 10% mean area diameter and the 50% mean area diameter of primary particles, the diameters being calculated as circle equivalent diameters, from the following equations (1) and (2).

$$10\% \text{ Mean area diameter of primary particles} = 2 \times (s_{10}/\pi)^{1/2} \quad (1)$$

$$50\% \text{ Mean area diameter of primary particles} = 2 \times (s_{50}/\pi)^{1/2} \quad (2)$$

Similarly, a cumulative curve is created as described above from the obtained cross-sectional areas to determine the cross-sectional areas $S_{10}$ and $S_{50}$ of secondary particles at the points where the cumulative curve reaches 10% and 50%, and these cross-sectional areas are used to calculate the 10% mean area diameter and the 50% mean area diameter of secondary particles, the diameters being calculated as circle equivalent diameters, from the following equations (3) and (4).

$$10\% \text{ Mean area diameter of secondary particles} = 2 \times (S_{10}/\pi)^{1/2} \quad (3)$$

$$50\% \text{ Mean area diameter of secondary particles} = 2 \times (S_{50}/\pi)^{1/2} \quad (4)$$

As the mean area diameter of primary particles is smaller, impurities existing in crystal particle boundaries tend to increase, and crystallinity and light-emitting efficiency tend to decrease. The 50% mean area diameter of primary particles of the present invention is 5 μm or more. In addition, as the ratio of the 50% mean area diameter of primary particles to the 50% mean area diameter of secondary particle is larger, the proportion of the particle boundary area between primary particles in secondary particles is smaller, and light-emitting efficiency is larger. The preferable ratio of the 50% mean area diameter of primary particles to the 50% mean area diameter of secondary particle is 0.56 or more.

In addition, as the average number of primary particles in secondary particles is smaller, light-emitting efficiency is larger. The ratio of the number of primary particles to the number of secondary particles is calculated by counting the number of secondary particles and the number of secondary particles constituting secondary particles in the image of the α-SiAlON, obtained from the EBSD method, and obtaining the ratio of the number of primary particles to the number of secondary particles. The average number of primary particles in secondary particles is preferably 2.5 or less.

As the 10% mean area diameter of primary particles is smaller, many primary particles having a small diameter are included. As many primary particles having a small diameter are included, the proportion of crystal particle boundaries increases and scattering of light increases, and light-emitting efficiency decreases.

Therefore, the preferable 10% mean area diameter of primary particles is 3 μm or more. In addition, as the ratio of the 10% mean area diameter of primary particles to the 10% mean area diameter of secondary particles is larger, the proportion of the particle boundary area between primary particles in secondary particles is smaller, and light-emitting efficiency is larger. The preferable ratio of the 10% mean area diameter of primary particles to the 10% mean area diameter of secondary particle is 0.65 or more.

The control of the mean area diameter of primary particles can be carried out by heating treatment conditions, pulverizing conditions of synthesized products, and the like, in addition to the composition of raw material powders, and the particle diameter and the amount of an α-SiAlON powder synthesized in advance, to be added to the raw material powders. The upper limit of the mean area diameter of primary particles is naturally determined according to the upper limit of the size of secondary particles described later.

In order to further improve the light-emitting intensity of the α-SiAlON, the D50 particle diameter of secondary particles of the α-SiAlON may be 13 μm or more and 30 μm or less. The D50 refers to a 50% particle diameter (50% mean volume diameter) in an accumulated fraction by volume.

If the D50 particle diameter of secondary particles of the α-SiAlON is too large, secondary particles tend not to be sufficiently dispersed in a resin when being applied to a light-emitting device such as a white LED, thereby causing a decrease in luminance and a variation in color. Therefore, the D50 particle diameter of secondary particles of the α-SiAlON is preferably 30 μm or less, and particularly preferably 20 μm or less. On the contrary, if the D50 particle diameter of secondary particles of the α-SiAlON is too small, the light-emitting efficiency of the phosphor itself tends to decrease, and the luminance of the light-emitting device tends to decrease by scattering of light. Therefore, the D50 particle diameter is preferably 13 μm or more.

The control of the D50 particle diameter of secondary particles of the α-SiAlON can be carried out by pulverizing or classification, or can be carried out in a step of placing secondary particles into water to remove secondary particles that have a small diameter and thus settle out with difficulty.

Since the α-SiAlON of the present invention is efficiently excited by, in particular, near-ultraviolet to blue light to exhibit light-emitting characteristics having a peak at a wavelength region of 590 to 630 nm, it is excellent as a yellow to orange phosphor for light-emitting devices having a near-ultraviolet or blue LED as a light-emitting light source. Therefore, the α-SiAlON of the present invention can be used alone or in combination with other phosphor to be suitably used for various light-emitting elements, in particular, white LEDs having an ultraviolet LED chip or a blue LED chip as a light source.

(Method for Manufacturing α-SiAlON)

The method for manufacturing the α-SiAlON of the present invention is described. In the process of synthesizing the α-SiAlON, a part of raw material powders is mainly reacted to form a liquid phase, and each element moves via the liquid phase, thereby promoting the formation of a solid solution and the growth of particles. An α-SiAlON having a low oxygen content, synthesized using calcium nitride as a calcium raw material, can include a solid solution of calcium in a high concentration. Particularly, in the case where the concentration of the solid solution of Ca is high, a phosphor is obtained which has a light-emitting peak wavelength at a higher wavelength region (590 nm or more) than that having the conventional composition in which an oxide raw material is used. Specifically, it is preferable that x+v<1.5 be satisfied in the general formula. Some of Ca can also be substituted with Li, Mg, Y and a lanthanide element (except for La and Ce) to carry out fine adjustment of a light-emitting spectrum.

Raw material powders other than the above include silicon nitride, aluminium nitride, and an Eu compound. The Eu compound includes europium oxide, a compound to be converted into europium oxide after heating, and europium nitride, and europium nitride that can preferably reduce the amount of oxygen in the system is preferable.

If an appropriate amount of the α-SiAlON powder synthesized in advance is added to raw material powders, this can serve as the base of the growth of particles to provide an α-SiAlON whose short axis diameter is relatively large, and the form of the α-SiAlON to be added can be changed to thereby control the shape of particles.

As the method of mixing the respective raw materials, there are a method of dry-mixing the raw materials, and a method including wet-mixing the raw materials in an inactive solvent that does not substantially react with the respective raw material components, and then removing the solvent. The mixing device includes a V-type mixer, a rocking mixer, a ball mill, and a vibration mill. With respect to the mixing of calcium nitride that is instable in the atmosphere, hydrolysis or oxidization thereof influences characteristics of synthesized products, and thus such mixing is preferably carried out in a glove box under an inert atmosphere.

The powders obtained by mixing (hereinafter, simply referred to as the raw material powders) are charged into a vessel that has low reactivity with the raw materials and a phosphor to be synthesized, for example, a boron nitride vessel, and heated in a nitrogen atmosphere in the temperature range of 1650 to 1850° C. for a predetermined time to thereby provide an α-SiAlON phosphor.

The temperature of the heating treatment can be 1650° C. or higher to thereby suppress the amount of the remaining unreacted products and allow primary particles to sufficiently grow, and the temperature can be 1850° C. or lower to thereby suppress the remarkable sintering between particles.

The charging of the raw material powders into the vessel is preferably bulky from the viewpoint of suppressing the sintering between particles during heating. Specifically, when the raw material powders are charged into the vessel, the bulk density is preferably 0.6 g/cm$^3$ or less.

The heating time in the heating treatment is preferably 2 hours or more and 24 hours or less as such a time range that does not cause disadvantages such as that many unreacted substances exist, that the growth of primary particles is insufficient, and that the sintering between particles occurs.

The above steps allow an α-SiAlON having an ingot-like outer shape to be produced. This ingot-like α-SiAlON is subjected to a pulverizing step by a pulverizer such as a crusher, mortar pulverizing, a ball mill, a vibration mill, and a jet mill, and a sieve classification step after such a pulverizing treatment, thereby providing an α-SiAlON powder in which the D50 particle diameter of secondary particles is adjusted. In addition, a step of dispersing secondary particles in an aqueous solution and removing them that have a small diameter and thus settle out with difficulty can be carried out to adjust the D50 particle diameter of secondary particles.

(Light-Emitting Device)

Figure 2:
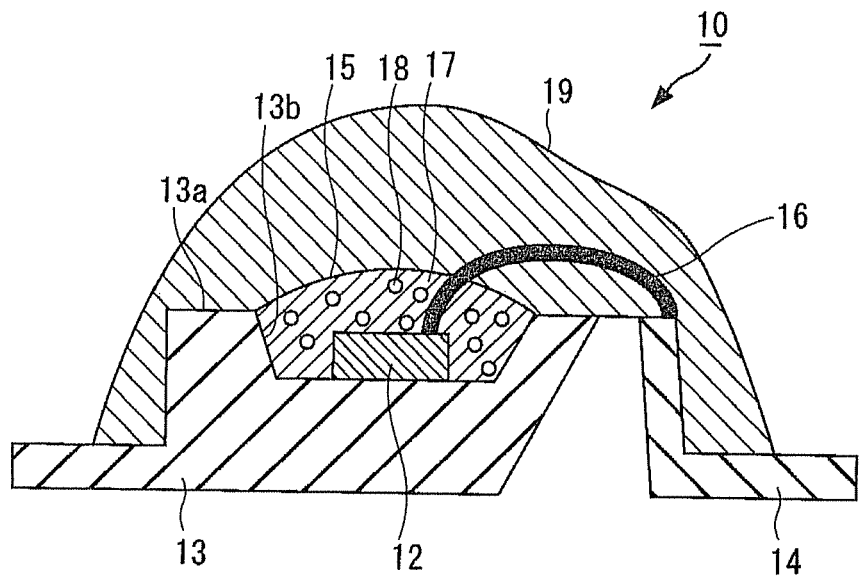
FIG. 2 is a cross-sectional view schematically illustrating the construction of the light-emitting device of the present invention.

A light-emitting device according to an embodiment of the present invention is described with reference to FIG. 2. FIG. 2 is a cross-sectional view schematically illustrating the construction of a light-emitting device 10 of the present invention using an α-SiAlON. As illustrated in FIG. 2, the light-emitting device 10 of the present invention is formed from an LED chip as a light-emitting light source 12, a first lead frame 13 on which the light-emitting light source 12 is mounted, a second lead frame 14, a wavelength conversion member 15 with which the light-emitting light source 12 is covered, a bonding wire 16 for electrically connecting the light-emitting light source 12 and the second lead frame 14, and a cap 19 made of a synthetic resin, with which these are covered. The wavelength conversion member 15 has a phosphor 18, and a sealing resin 17 having the phosphor 18 dispersed therein.

A concave portion 13b on which a light-emitting diode chip as the light-emitting light source 12 is to be installed is formed on an upper portion 13a of the first lead frame 13. The concave portion 13b has a substantial funnel shape having a pore diameter gradually enlarged upward from the bottom surface thereof, and the inner surface of the concave portion 13b serves as a reflecting surface. An electrode on the lower surface of the light-emitting light source 12 is die bonded to the bottom surface of the reflecting surface. Other electrode formed on the upper surface of the light-emitting light source 12 is connected to the surface of the second lead frame 14 via the bonding wire 16.

As the light-emitting light source 12, any of various LED chips can be used, and an LED chip emitting light of 300 nm to 500 nm as a wavelength of near-ultraviolet to blue light is particularly preferable.

As the phosphor 18 for use in the wavelength conversion member 15 of the light-emitting device 1, in addition to the α-SiAlON of the present invention, a β-SiAlON having europium, cerium, strontium, and calcium in the form of solid solutions, $CaAlSiN_3$, or YAG can be used alone or in the form of the mixture. They can be used in combination to thereby control the wavelength of light of the light-emitting device 10.

The α-SiAlON of the present invention has yellow to orange light-emitting characteristics having a peak at a wavelength ranging from 590 nm or more and 630 nm or less when the α-SiAlON is irradiated with near-ultraviolet light or visible light of a wavelength of 300 nm or more and 590 nm or less as an excitation source. Therefore, a near-ultraviolet LED chip or a blue LED chip can be used as the light-emitting light source 12, and the α-SiAlON of the present invention, or a combination of the α-SiAlON of the present invention with a phosphor emitting red light of a wavelength of 600 nm or more and 700 nm or less, a blue light-emitting phosphor or a green light-emitting phosphor alone, or a mixture thereof can be used as the phosphor 18, thereby obtaining white light.

The emission color of the light-emitting device 10 of the present invention can also be changed to one other than white light, such as light bulb color, by adjusting the light-emitting wavelength and the proportion of a phosphor to be blended as the phosphor 18.

The light-emitting device 10 of the present invention has a high light-emitting intensity because the α-SiAlON used as the phosphor 18 has a high light-emitting efficiency.

EXAMPLES

Hereinafter, Examples according to the present invention will be described in detail with reference to Table 1.

TABLE 1

|  |  | Unit | Example 1 | Example 2 | Example 3 | Example 4 | Comparative Example 1 |
|---|---|---|---|---|---|---|---|
| Configuration | 50% Mean area diameter of primary particles: $D1_{(50)}$ | μm | 5.7 | 7.7 | 11.7 | 11.9 | 4.8 |
|  | 50% Mean area diameter of secondary particles: $D2_{(50)}$ | μm | 9.5 | 13.4 | 18.5 | 21.5 | 8.8 |
|  | $D1_{(50)}/D2_{(50)}$ |  | 0.60 | 0.57 | 0.63 | 0.55 | 0.55 |
|  | 10% Mean area diameter of primary particles: $D1_{(10)}$ | μm | 3.0 | 4.0 | 5.8 | 5.9 | 2.7 |
|  | 10% Mean area diameter of secondary particles: $D2_{(10)}$ | μm | 4.4 | 6.1 | 7.2 | 8.4 | 4.2 |
|  | $D1_{(10)}/D2_{(10)}$ |  | 0.68 | 0.66 | 0.81 | 0.70 | 0.64 |
|  | Average number of primary particles in secondary particles |  | 2.0 | 2.0 | 2.1 | 2.8 | 2.6 |
|  | 50% Mean volume diameter of secondary particles: D50 | μm | 13.5 | 17.7 | 14.1 | 16.4 | 11.6 |
| Evaluation | Light-emitting efficiency | % | 66.6 | 69.1 | 66.5 | 64.2 | 60.9 |
|  | Light-emitting peak wavelength | nm | 597 | 596 | 598 | 598 | 599 |

Example 1

Synthesis of α-SiAlON

The composition of raw material powders blended was set as follows: 53.4% by mass of an α-silicon nitride powder (NP400 Grade manufactured by Denki Kagaku Kogyo K. K.), 19.3% by mass of an aluminium nitride powder (F Grade manufactured by Tokuyama Corporation), 0.9% by mass of a europium oxide powder (RU Grade manufactured by Shin-Etsu Chemical Co., Ltd.), 15.0% by weight of an α-SiAlON powder having a D50 of secondary particles of 12.1 μm, synthesized in advance; and a mixture thereof was mixed using a rocking mixer (RM-10 manufactured by Aichi Electric Co., Ltd.) in a dry manner for 60 minutes, and then passed throughout a stainless sieve having an aperture of 150 μm, thereby providing a pre-mixed powder.

The pre-mixed powder was loaded into a glove box under a nitrogen atmosphere, and mixed with a calcium nitride powder manufactured by Kojundo Chemical Lab. Co., Ltd. The mixing ratio was follows: pre-mixed powder:calcium nitride powder=88.6:11.4 (mass ratio). Thereafter, the mixture was passed through a stainless sieve having an aperture of 250 μm to provide a raw material-mixed powder in the glove box, and then 120 g of the raw material-mixed powder was charged to a cylindrical boron nitride vessel having an internal volume of 0.4 L, equipped with a lid, (N-1 Grade manufactured by Denki Kagaku Kogyo K. K.).

The raw material-mixed powder, together with the vessel, was subjected to a heating treatment at 1800° C. for 16 hours in an electric furnace with a carbon heater at atmospheric pressure in a nitrogen atmosphere. Because of calcium nitride included in the raw material-mixed powder being easily hydrolyzed in air, the boron nitride vessel charged with the raw material-mixed powder was rapidly set to the electric furnace and immediately evacuated after being removed from the glove box, thereby preventing calcium nitride from being reacted.

The synthesized product was lightly crushed by a mortar, and passed throughout a sieve having an aperture of 150 μm, thereby providing a phosphor powder. The phosphor powder was subjected to a powder X-ray diffraction measurement using a CuKα ray (X-ray Diffraction, hereinafter, referred to as the XRD measurement) to examine the crystalline phase thereof, and the existing crystalline phase was found to be an α-SiAlON single phase.

(10% Mean Area Diameter and 50% Mean Area Diameter Determined by EBSD)

The 10% mean area diameter and the 50% mean area diameter of primary particles of the α-SiAlON of Example 1 were measured using the EBSD method. In the EBSD method, a device, in which a measuring device 3 for use in the electron backscatter diffraction image method (OIM device manufactured by EDAX-TSL Inc.) was added to a scanning electron microscope 2 (FE-SEM, JSM-7001F Model manufactured by JEOL Ltd.), was used for measurement.

Specifically, the α-SiAlON of Example 1 was irradiated with an electron beam to allow scattering corresponding to a crystal structure and a crystal orientation to occur, and the shape of the scattering pattern was analyzed by a software (OIM, Ver5.2 manufactured by EDAX-TSL Inc.) to identify crystal orientations in individual phosphor particles. Furthermore, the particle shapes in individual crystal orientations were image-analyzed, and the 10% mean area diameter and the 50% mean area diameter of primary particles, and the 10% mean area diameter and the 50% mean area diameter of secondary particles were calculated from the above equations (1) to (4). Furthermore, the average number of primary particles in secondary particles was calculated from the obtained image.

The measurement conditions of the crystal orientation determined by the EBSD method are shown below.
  Acceleration voltage: 15 kV
  Working distance: 15 mm
  Sample inclination angle: 70°
  Measurement region: 80 μm×200 μm
  Step width: 0.2 μm
  Measurement time: 50 msec/step
  Number of data points: about 400,000 points
  (Image Analysis)

Figure 3:
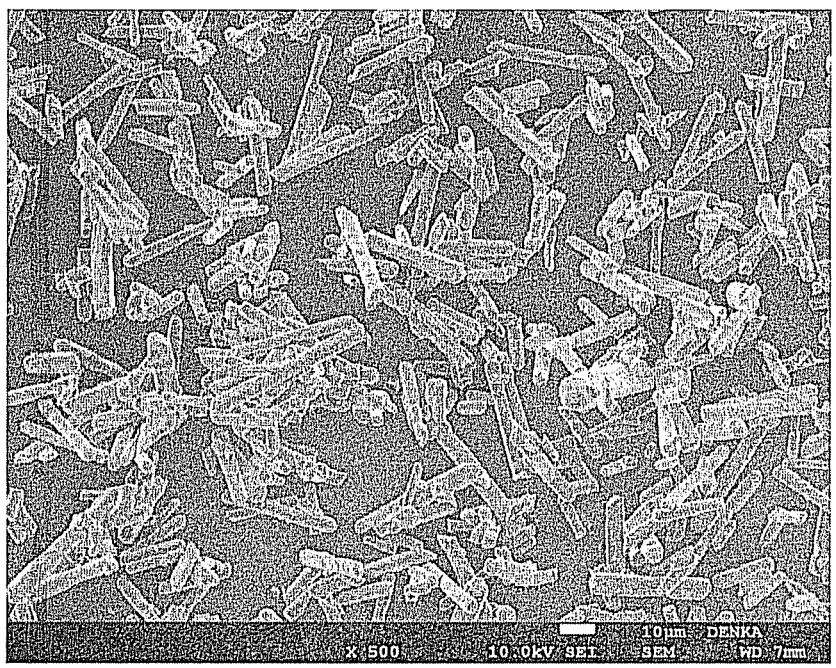
FIG. 3 shows a scanning electron microscope image (SEM image; Scanning Electron Microscope image) of an α-SiAlON of Example 1.
Figure 4:
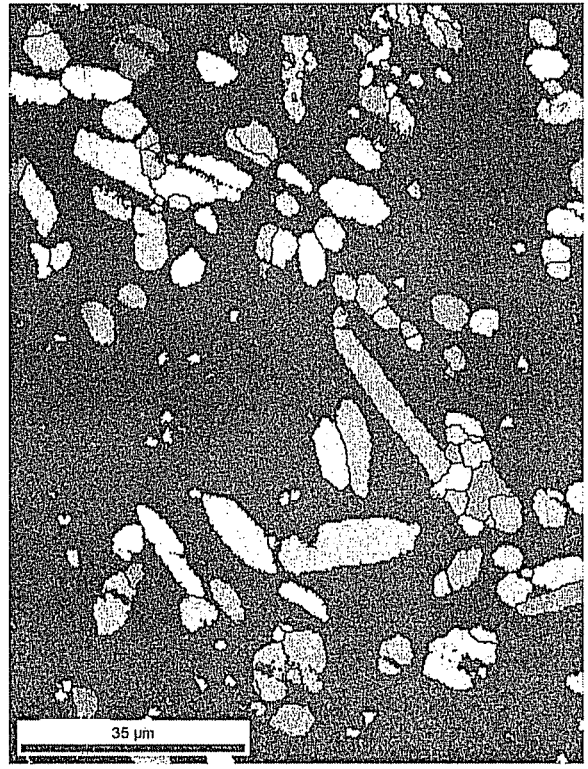
FIG. 4 shows an image (EBSD image) of the α-SiAlON of Example 1, obtained by the EBSD method.

Image analysis was carried out by making the EBSD image in FIG. 4 from the α-SiAlON of Example 1 shown in the scanning electron microscope image in FIG. 3 (SEM image, electron acceleration voltage: 15 kV, magnification: 500 times). In FIG. 4, parts having identical crystal orientations are shown with a single color region, and the single color region corresponds to primary particles. The larger number of primary particles to be analyzed allows statistical analysis accuracy to be improved. If the number of primary particles is 3000 or more, sufficient date for analysis is obtained. As shown in Table 1, the 50% mean area diameter and the 10% mean area diameter of primary particles of the α-SiAlON of Example 1, determined by this image analysis, were 5.7 µm and 3.0 µm, respectively. The ratio of the 50% mean area diameter of primary particles to the 50% mean area diameter of secondary particles and the ratio of the 10% mean area diameter of primary particles to the 10% mean area diameter of secondary particles were 0.60 and 0.68, respectively, and the average number of primary particles in secondary particles was 2.0.

(D50)

The particle size distribution of secondary particles of the α-SiAlON of Example 1 was measured by the laser diffraction scattering method to determine D50. The D50 of the α-SiAlON of Example 1 was 13.5 µm.

(Light-Emitting Peak Wavelength)

A concave cell was charged with the α-SiAlON of Example 1 so that the surface thereof was flat and smooth, and an integrating sphere was attached thereto. To this integrating sphere was introduced monochromatic light of a wavelength of 455 nm, dispersed from a light-emitting light source (Xe lamp), by using an optical fiber. The α-SiAlON was irradiated with this monochromatic light as an excitation source, and the fluorescence spectrum of a sample was measured using a spectrophotometer (MCPD-7000 manufactured by Otsuka Electronics Co., Ltd.), thereby determining a light-emitting peak wavelength. The light-emitting peak wavelength in Example 1 was 597 nm as shown in Table 1.

(Light-Emitting Efficiency)

The same measuring instrument was used, a standard reflector having a reflectance of 99% (manufactured by Labsphere Inc., trade name "Spectralon") was set to a sample section, and the spectrum of excitation light of a wavelength of 455 nm was measured. In this time, the number of photons of excitation light ($Q_{ex}$) was calculated from the spectrum in the wavelength range of 450 to 465 nm. Then, the α-SiAlON was set to the sample section, and the number of light-emitting photons ($Q_{em}$) was calculated from the obtained spectrum data. The number of light-emitting photons was calculated in the range of 465 to 800 nm. Light-emitting efficiency (=$Q_{em}/Q_{ex}\times100$) was determined from the obtained three kinds of numbers of photons. The light-emitting efficiency in the case of the excitation by blue light of a wavelength of 455 nm was 66.6%.

Example 2

A pre-mixed powder having the following blending composition of raw material powders of an α-SiAlON of Example 2: 44.0% by mass of an α-silicon nitride powder, 15.9% by mass of an aluminum nitride powder, 0.8% by mass of an europium oxide powder, and 30.0% by weight of an α-SiAlON powder having a D50 of secondary particles of 13.5 µm, synthesized in advance; was used, and further mixed with a calcium nitride powder in a glove box under a nitrogen atmosphere so as to have a mixing ratio of the pre-mixed powder and a calcium nitride powder (mass ratio)=90.7:9.3. The grades of the used raw material powders other than the α-SiAlON powder were the same as those in Example 1. The conditions other than these were the same as those in Example 1 to prepare the α-SiAlON of Example 2.

Figure 5:
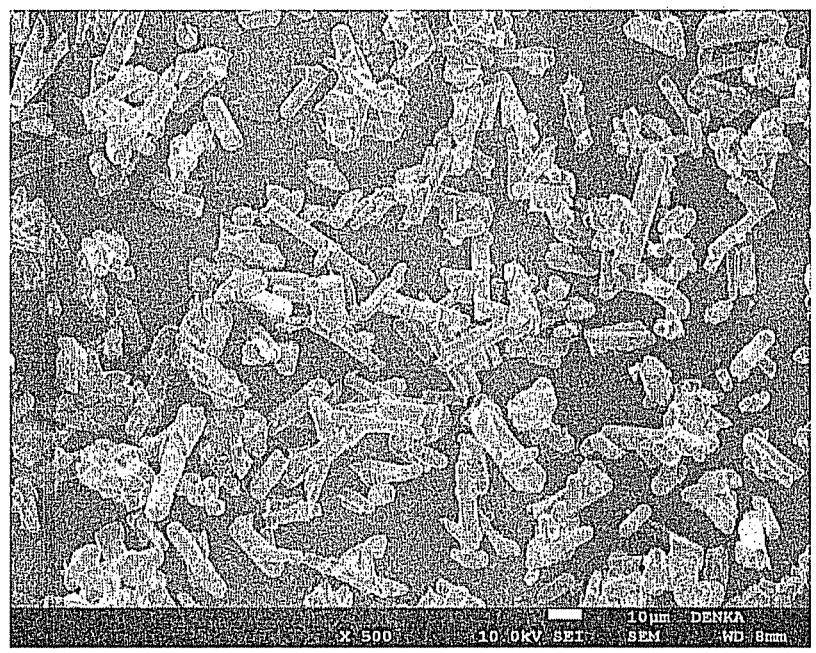
FIG. 5 shows a SEM image of an α-SiAlON of Example 2.
Figure 6:
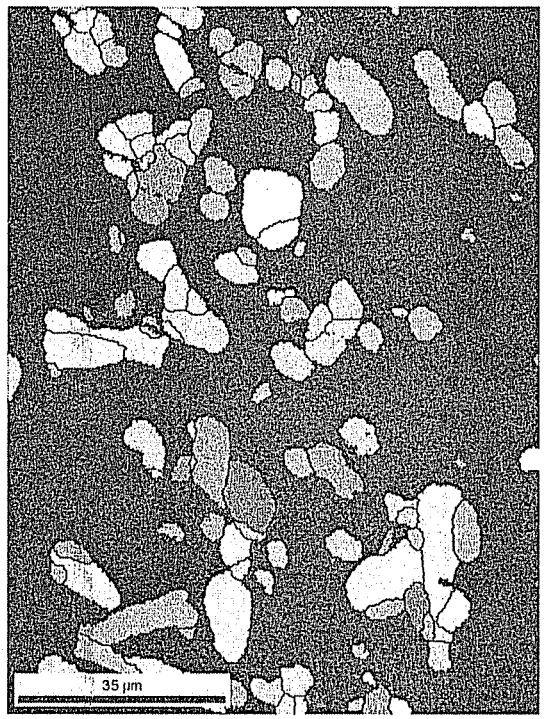
FIG. 6 shows an EBSD image of the α-SiAlON of Example 2.

The SEM image of the α-SiAlON of Example 2 is shown in FIG. 5. The EBSD image thereof is shown in FIG. 6. The 50% mean area diameter and the 10% mean area diameter of primary particles of the α-SiAlON of Example 2 were calculated in the same manner as in Example 1, and, as shown in Table 1, they were found to be 7.7 µm and 4.0 µm, respectively. The ratio of the 50% mean area diameter of primary particles to the 50% mean area diameter of secondary particles, and the ratio of the 10% mean area diameter of primary particles to the 10% mean area diameter of secondary particles were 0.57 and 0.66, respectively, and the average number of primary particles in secondary particles was 2.0. Furthermore, the particle size distribution of secondary particles was measured to determine D50, and, as shown in Table 1, the D50 was found to be 17.7 µm. In the evaluation of the α-SiAlON of Example 2 by a spectrofluorophotometer, the light-emitting efficiency and the peak wavelength were 69.1% and 596 nm as shown in Table 1.

Example 3

A pre-mixed powder having the following blending composition of raw material powders of an α-SiAlON of Example 3: 56.6% by mass of an α-silicon nitride powder, 20.4% by mass of an aluminium nitride powder, 1.0% by mass of an europium oxide powder, and 10.0% by weight of an α-SiAlON powder having a D50 of secondary particles of 19.4 µm, synthesized in advance; was used, and further mixed with a calcium nitride powder in a glove box under a nitrogen atmosphere so as to have a mixing ratio of the pre-mixed powder and a calcium nitride powder (mass ratio)=88.0:12.0. The used raw material powders other than the α-SiAlON powder were the same as those in Examples 1 and 2. The raw material powders were charged to a boron nitride vessel in the same manner as in Examples 1 and 2, and then subjected to a heating treatment in an electric furnace, thereby providing a synthesized product. Thereafter, the synthesized product was pulverized by a supersonic jet pulverizer (PJM-80 Model manufactured by Nippon Pneumatic Mfg. Co., Ltd.) at a pulverizing air pressure of 0.2 MPa, and passed throughout a sieve having an aperture of 150 µm, thereby providing a phosphor powder.

Figure 7:
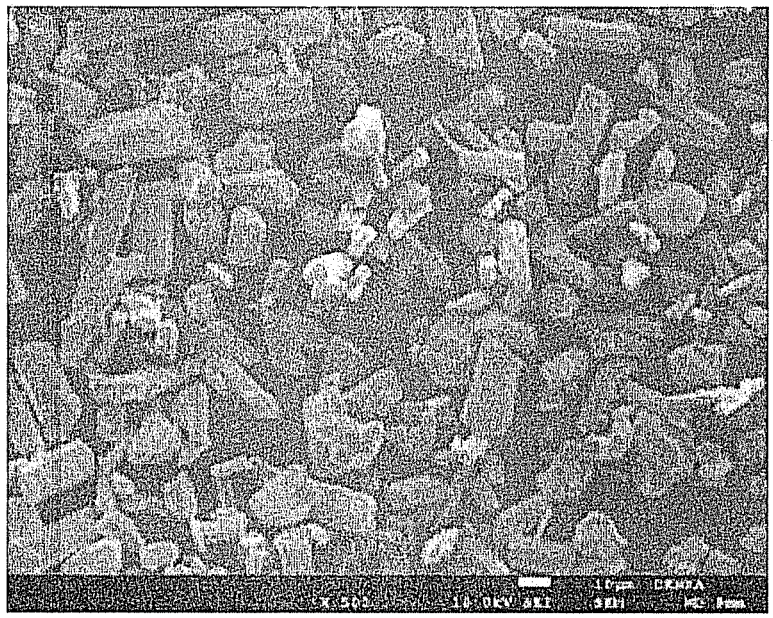
FIG. 7 shows a SEM image of an α-SiAlON of Example 3.
Figure 8:
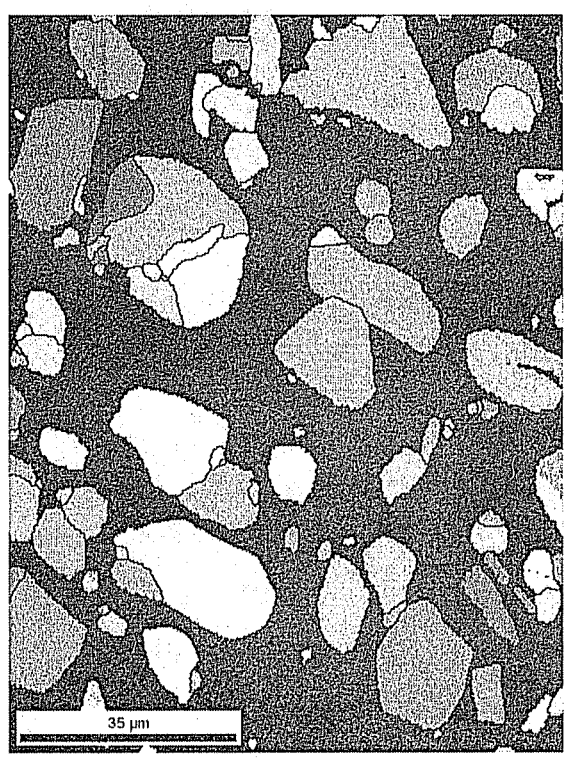
FIG. 8 shows an EBSD image of the α-SiAlON of Example 3.
Figure 9:
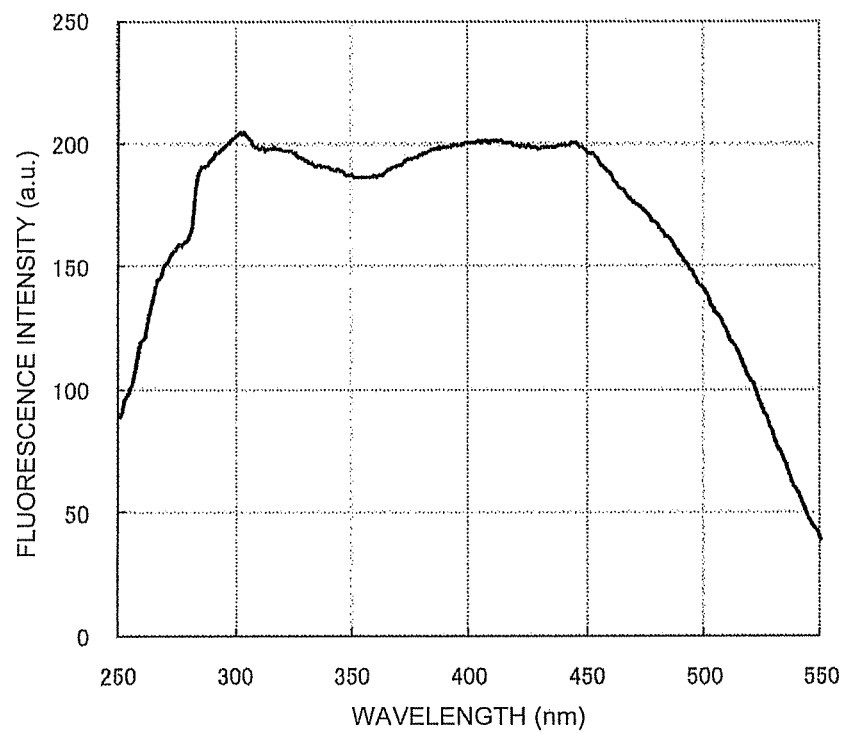
FIG. 9 shows an excitation spectrum when measuring the fluorescence intensity at a wavelength of 598 nm of a phosphor according to Example 3.

The SEM image of the α-SiAlON of Example 3 is shown in FIG. 7. The EBSD image thereof is shown in FIG. 8. The 50% mean area diameter and the 10% mean area diameter of primary particles of the α-SiAlON of Example 3 were calculated in the same manner as in Examples 1 and 2, and, as shown in Table 1, they were found to be 11.7 µm and 5.8 µm, respectively. The ratio of the 50% mean area diameter of primary particles to the 50% mean area diameter of secondary particles, and the ratio of the 10% mean area diameter of primary particles to the 10% mean area diameter of secondary particles were 0.63 and 0.81, respectively, and the average number of primary particles in secondary particles was 2.1. D50 was calculated by measuring the particle size distribution of secondary particles, and, as shown in Table 1, it was found to be 14.1 µm. In the evaluation of the α-SiAlON of Example 3 by a spectrofluorophotometer, the light-emitting efficiency and the peak wavelength were 66.5% and 598 nm, as shown in Table 1. Furthermore, the excitation spectrum of the α-SiAlON of Example 3 was measured by the above spectrofluorophotometer. FIG. 9 shows an excitation spectrum on measuring the fluorescence intensity at a wavelength of 598 nm of a phosphor of Example 3. The phosphor of the present invention is excited at a wide wavelength region from ultraviolet to visible. It is efficiently excited at a wavelength of, in particular, 300 to 500 nm, and thus is suitable for a light-emitting device having near-ultraviolet and blue LEDs as an excitation source.

Comparative Example 1

An α-SiAlON of Comparative Example 1 was prepared with the same blending composition as that of the raw material powders of the α-SiAlON of Example 1 except that an α-SiAlON powder having a D50 of secondary particles of 10.4 μm, synthesized in advance, was used.

Figure 10:
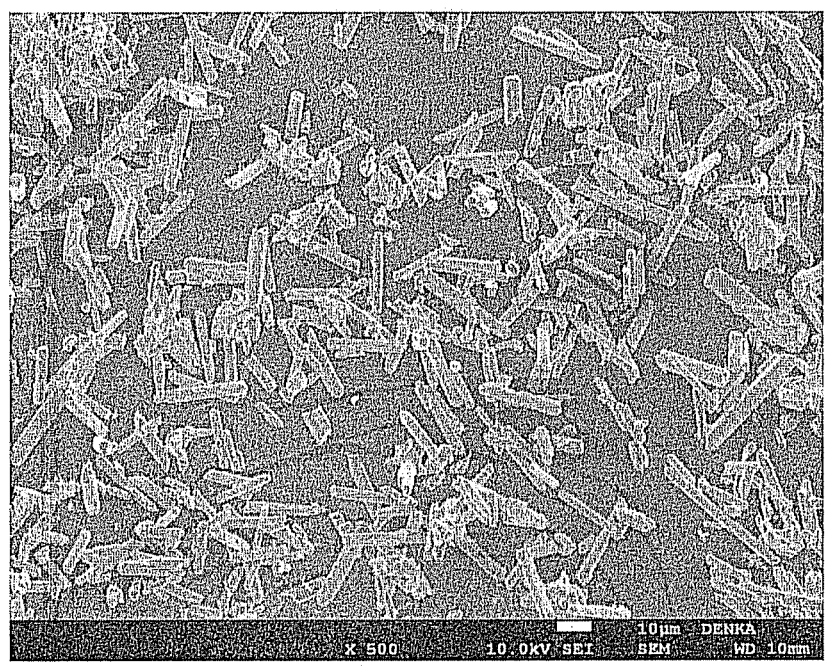
FIG. 10 shows a SEM image of an α-SiAlON of Comparative Example 1.
Figure 11:
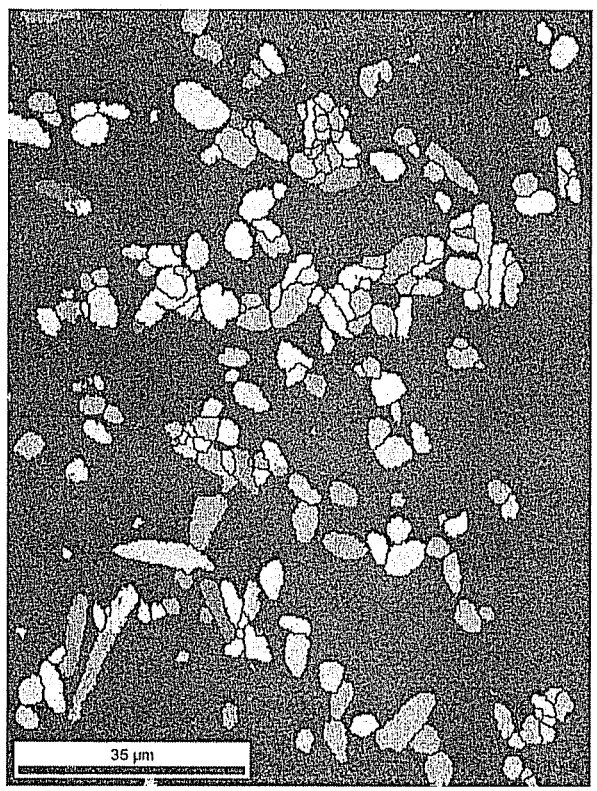
FIG. 11 shows an EBSD image of the α-SiAlON of Comparative Example 1.

The SEM image of the α-SiAlON of Comparative Example 1 is shown in FIG. 10. The EBSD image thereof is shown in FIG. 11. The 50% mean area diameter and the 10% mean area diameter of primary particles of the α-SiAlON of Comparative Example 1 were calculated in the same manner as in Examples 1 to 3 and, as shown in Table 1, they were found to be 4.8 μm and 2.7 μm. The ratio of the 50% mean area diameter of primary particles to the 50% mean area diameter of secondary particles, and the ratio of the 10% mean area diameter of primary particles to the 10% mean area diameter of secondary particles were 0.55 and 0.64, respectively, and the average number of primary particles in secondary particles was 2.6. Furthermore, the particle size distribution of secondary particles was measured to determine D50, and, as shown in Table 1, the D50 was found to be 11.6 μm. In the evaluation of the α-SiAlON of Comparative Example 1 by a spectrofluorophotometer, the light-emitting efficiency and the peak wavelength were 60.9% and 599 nm as shown in Table 1, and the light-emitting efficiency was lower than those in Examples 1 to 3.

Example 4

When the synthesized product obtained after the heating treatment in Example 3 was pulverized by the supersonic jet pulverizer, it was pulverized at a lower pulverizing air pressure than that in Example 3, of 0.15 MPa, and passed throughout a sieve having an aperture of 150 μm, thereby providing a phosphor powder. An α-SiAlON of Example 4 is an example in which the 50% mean area diameter of primary particle is 5 μm or more, but the ratio of the 50% mean area diameter of primary particles to the 50% mean area diameter of secondary particles of the α-SiAlON is less than 0.56. The light-emitting efficiency and the peak wavelength of a phosphor 18 of Example 4 were 64.2% and 598 nm as shown in Table 1.

Example 5

An example of the light-emitting device using the α-SiAlON is described in detail with reference to FIG. 2. The phosphor 18 is a mixture of the α-SiAlON of Example 3 with β-SiAlON: Eu phosphor, having a composition of $Si_{5.75}A_{0.25}O_{0.25}N_{7.75}$: Eu. The light-emitting peak wavelength of the β-SiAlON: Eu phosphor was 543 nm, and the light-emitting efficiency of this phosphor with excitation of 450 nm was 54%.

The phosphor 18 was blended with the sealing resin 17 as follows. The phosphor 18 was individually subjected to a silane coupling treatment with a silane coupling agent (KBE402 manufactured by Shin-Etsu Silicone Co., Ltd.) in advance, and the phosphor 18 subjected to the silane coupling treatment was kneaded with an epoxy resin (NLD-SL-2101 manufactured by Sanyu Rec Co., Ltd.) as the sealing resin 17, thereby completing the blending.

As the light-emitting light source 12, a blue LED chip having a light-emitting wavelength of 450 nm was used.

Comparative Example 2

A light-emitting device of Comparative Example 2 was prepared in the same manner as in Example 5 except that the α-SiAlON of Example 3 used as the phosphor 18 in light-emitting device 10 of Example 5 was changed to the α-SiAlON of Comparative Example 1.

The light-emitting device 10 of Example 5 and the light-emitting device of Comparative Example 2 were emitted under identical conditions, and the central illuminance and CIE chromaticity (CIE1931) under identical conditions were measured by a luminance meter. When the central illuminance was compared in a white light-emitting device with chromaticity coordinates (x, y) of (0.31, 0.32), the light-emitting device of Example 5 was found to be 1.22 times brighter than the light-emitting device of Comparative Example 2.

REFERENCE SIGNS LIST

1: device for use in EBSD method
2: scanning electron microscope
2A: lens tube
2B: stage unit
2C: stage control Unit
2D: electron beam scanning unit
2E: control computer
3: measuring device for use in electron backscatter diffraction image method
4: sample
5: electron beam
6: backscattered electron
7: fluorescent screen
8: camera
10: light-emitting device
12: light-emitting light source (LED chip)
13: first lead frame
13a: upper portion
13b: concave portion
14: second lead frame
15: wavelength conversion member
16: bonding wire
17: sealing resin
18: phosphor (α-SiAlON)
19: cap Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. An α-SiAlON represented by the general formula: $(M)_x (Eu)_y(Si)_{12-(m+n)}(Al)_{m+n}(O)_n(N)_{16-n}$ (wherein M denotes one or more elements including at least Ca, selected from the group consisting of Li, Mg, Ca, Y and lanthanide elements (except for La and Ce)), wherein a 50% mean area diameter of primary particles of the α-SiAlON is 5 μm or more, and wherein a D50 particle diameter (50% mean volume diameter) of secondary particles of the α-SiAlON is 13 μm or more and 30 μm or less.

2. The α-SiAlON according to claim 1, wherein a ratio of the 50% mean area diameter of primary particles to a 50% mean area diameter of secondary particles of the α-SiAlON is 0.56 or more.

3. The α-SiAlON according to claim 1, wherein an average number of primary particles in secondary particles of the α-SiAlON is 2.5 or less.

4. The α-SiAlON according to claim 1, wherein a 10% mean area diameter of primary particles of the α-SiAlON is 3 μm or more.

5. The α-SiAlON according to claim 4, wherein a ratio of the 10% mean area diameter of primary particles to a 10% mean area diameter of secondary particles of the α-SiAlON is 0.65 or more.

6. A light-emitting device comprising a light-emitting light source and a wavelength conversion member, wherein the wavelength conversion member includes a phosphor, and the phosphor is the α-SiAlON according to claim 1.

7. The light-emitting device according to claim 6, wherein the phosphor further includes a β-SiAlON having Eu in the form of a solid solution.

8. The light-emitting device according to claim 6, wherein the phosphor further includes a β-SiAlON having Eu in the form of a solid solution, and $CaAlSiN_3$.

9. The light-emitting device according to claim 6, wherein the light-emitting light source is an LED chip for generating light of a wavelength of 300 nm to 500 nm.

10. An illumination device having the light-emitting device according to claim 7.

11. A signal device having the light-emitting device according to claim 6.

12. A liquid crystal panel having the light-emitting device according to claim 6.

13. An image display device having the light-emitting device according to claim 6.

* * * * *